United States Patent
Sato

(10) Patent No.: US 9,103,023 B2
(45) Date of Patent: *Aug. 11, 2015

(54) NONMAGNETIC MATERIAL PARTICLE-DISPERSED FERROMAGNETIC MATERIAL SPUTTERING TARGET

(75) Inventor: Atsushi Sato, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 263 days.

This patent is subject to a terminal disclaimer.

(21) Appl. No.: 13/131,124

(22) PCT Filed: Mar. 8, 2010

(86) PCT No.: PCT/JP2010/053754
§ 371 (c)(1),
(2), (4) Date: May 25, 2011

(87) PCT Pub. No.: WO2010/110033
PCT Pub. Date: Sep. 30, 2010

(65) Prior Publication Data
US 2011/0247930 A1 Oct. 13, 2011

(30) Foreign Application Priority Data
Mar. 27, 2009 (JP) ................................. 2009-078243

(51) Int. Cl.
*C23C 14/34* (2006.01)
*C22C 32/00* (2006.01)
*H01F 41/18* (2006.01)

(52) U.S. Cl.
CPC ......... *C23C 14/3414* (2013.01); *C22C 32/0026* (2013.01); *C22C 32/0052* (2013.01); *C22C 32/0068* (2013.01); *H01F 41/183* (2013.01); *B22F 2998/00* (2013.01)

(58) Field of Classification Search
CPC .................................................... C23C 14/3414
USPC ....................................... 204/298.13; 148/313
See application file for complete search history.

(56) References Cited

U.S. PATENT DOCUMENTS 5,523,173 A * 6/1996 Doerner et al. ............... 428/611
6,406,600 B1 * 6/2002 Takashima .............. 204/298.13
(Continued)

FOREIGN PATENT DOCUMENTS

JP          10-088333 A      4/1998
JP       2004-339586 A     12/2004
(Continued)

OTHER PUBLICATIONS
Hellwig et al., Role of boron on grain sizes and magnetic correlation lengths in recording media as determined by soft x-ray scattering, Applied Physics Letters, vol. 80, No. 7, Feb. 2002.*

*Primary Examiner* — Jie Yang
*Assistant Examiner* — Xiaowei Su
(74) *Attorney, Agent, or Firm* — Howson & Howson LLP

(57) ABSTRACT

A nonmagnetic material particle-dispersed ferromagnetic material sputtering target comprising a mixture of an alloy containing 5 mol % or more and 20 mol % or less of Cr, 5 mol % or more and 30 mol % or less of Pt, and Co as the remainder thereof, and nonmagnetic material particles, wherein the structure of the target includes a phase (A) in which the nonmagnetic material particles are uniformly micro-dispersed in the alloy, and a spherical alloy phase (B) dispersed in the phase (A) in which the ratio of its volume in the target is 4% or more and 40% or less. Obtained is a nonmagnetic material particle-dispersed ferromagnetic material sputtering target capable of improving the leakage magnetic flux to obtain a stable electrical discharge with a magnetron sputtering device, and which has high density and generates few particles during sputtering.

17 Claims, 9 Drawing Sheets

(56) References Cited

U.S. PATENT DOCUMENTS

| | | |
|---|---|---|
| 6,716,542 B2 | 4/2004 | Uwazumi et al. |
| 7,909,949 B2 | 3/2011 | Nakamura et al. |
| 7,927,434 B2 | 4/2011 | Nakamura et al. |
| 2002/0106297 A1 | 8/2002 | Ueno et al. |
| 2003/0228238 A1 | 12/2003 | Zhang et al. |
| 2004/0018110 A1 | 1/2004 | Zhang |
| 2004/0208774 A1 | 10/2004 | Zhang |
| 2005/0223848 A1 | 10/2005 | Ueno et al. |
| 2007/0134124 A1 | 6/2007 | Zhang |
| 2007/0189916 A1* | 8/2007 | Zhang ............... 419/66 |
| 2007/0209547 A1 | 9/2007 | Irumata et al. |
| 2008/0062575 A1 | 3/2008 | Shimizu |
| 2009/0229976 A1 | 9/2009 | Kato et al. |
| 2009/0242393 A1 | 10/2009 | Satoh |
| 2009/0308740 A1* | 12/2009 | Kato et al. ........ 204/298.13 |
| 2010/0089622 A1 | 4/2010 | Irumata et al. |
| 2010/0243435 A1 | 9/2010 | Kato |
| 2010/0270146 A1* | 10/2010 | Nonaka et al. ..... 204/298.13 |
| 2010/0320084 A1 | 12/2010 | Sato |
| 2011/0003177 A1 | 1/2011 | Wu et al. |
| 2011/0114879 A1 | 5/2011 | Arakawa et al. |
| 2011/0162971 A1 | 7/2011 | Nakamura et al. |
| 2011/0284373 A1 | 11/2011 | Sato et al. |
| 2012/0097535 A1 | 4/2012 | Ogino et al. |
| 2012/0118734 A1* | 5/2012 | Sato et al. ........ 204/298.13 |
| 2013/0001079 A1 | 1/2013 | Sato |
| 2013/0015061 A1 | 1/2013 | Sato |
| 2013/0112555 A1* | 5/2013 | Ogino et al. ....... 204/298.13 |
| 2013/0220804 A1 | 8/2013 | Ogino et al. |
| 2014/0001038 A1 | 1/2014 | Ogino et al. |

FOREIGN PATENT DOCUMENTS

| | | |
|---|---|---|
| JP | 2006-176808 A | 7/2006 |
| JP | 2009-001860 A | 1/2009 |
| JP | 2009-001861 A | 1/2009 |
| JP | 2009-001862 A | 1/2009 |
| JP | 2009-132976 A | 6/2009 |
| JP | 4422203 B | 2/2010 |
| WO | WO 2008081841 A1 * | 7/2008 |
| WO | 2009/054369 A1 | 4/2009 |
| WO | 2009/119812 A1 | 10/2009 |

* cited by examiner

Co ——— 20 μm    Cr ——— 20 μm    Pt ——— 20 μm

Si ——— 20 μm    O ——— 20 μm

Co ——— 20 μm   Cr ——— 20 μm   Pt ——— 20 μm

B ——— 20 μm   Ti ——— 20 μm   O ——— 20 μm

NONMAGNETIC MATERIAL PARTICLE-DISPERSED FERROMAGNETIC MATERIAL SPUTTERING TARGET

BACKGROUND OF THE INVENTION

The present invention relates to a nonmagnetic material particle-dispersed ferromagnetic material sputtering target for use in the deposition of a magnetic thin film of a magnetic recording medium, and particularly of a granular magnetic recording film of a hard disk adopting the perpendicular magnetic recording system, and to a sputtering target with a leakage magnetic flux which is able to obtain stable electrical discharge when sputtered with a magnetron sputtering device, and which has high density and generates few particles during sputtering.

In the field of magnetic recording, technology has been developed for improving the magnetic property by uniformly micro-dispersing nonmagnetic materials in a magnetic thin film. As one example thereof, with a hard disk recording medium adopting the perpendicular magnetic recording system, a granular film is adopted for blocking or weakening the magnetic interaction between magnetic particles in the magnetic recording film by using a nonmagnetic material, and improving the various properties as a magnetic recording medium.

Co—Cr—Pt—$SiO_2$ is known as one of the optimal materials for the foregoing granular film, and the granular film of Co—Cr—Pt—$SiO_2$ is generally produced by sputtering a nonmagnetic material particle-dispersed ferromagnetic material target in which $SiO_2$ as the nonmagnetic material is uniformly micro-dispersed in the ferromagnetic Co—Cr—Pt alloy base material having Co as its main component.

It is widely known that this kind of nonmagnetic material particle-dispersed ferromagnetic material sputtering target is produced with the powder metallurgy method since the nonmagnetic material particles cannot be uniformly micro-dispersed in the ferromagnetic alloy base material with the dissolution method.

For example, proposed is a method of performing mechanical alloying to alloy powder with an alloy phase produced with the rapid solidification method and powder configuring a ceramic phase, uniformly dispersing the powder configuring the ceramic phase in the alloy powder, and molding this by way of hot press to obtain a sputtering target for a magnetic recording medium (Patent Document 1).

Another way of preparing a nonmagnetic material particle-dispersed ferromagnetic material sputtering target is to use commercially available raw material powders for the respective components configuring the target, even without the alloy powder produced with the rapid solidification method. The raw material powders are weighed to the intended composition, mixed with well-known methods by using a ball mill or the like, and molding and sintering the mixed powder by hot press.

If a high density material can be obtained after sintering, it is generally known that the generation of particles, which becomes problematic during the sputtering, can be reduced.

There are various types of sputtering devices, but a magnetron sputtering device is broadly used in light of its high productivity for the deposition of the foregoing magnetic recording film.

This sputtering method makes a positive electrode substrate and a negative electrode target face each other, and generates an electric field by applying high voltage between the substrate and the target under an inert gas atmosphere.

Here, the sputtering method employs a fundamental principle where inert gas is ionized, plasma composed of electrons and positive ions is formed, and the positive ions in this plasma collide with the target (negative electrode) surface so as to discharge the atoms configuring the target. The extruded atoms adhere to the opposing substrate surface, wherein the film is formed. As a result of performing the sequential process described above, the material configuring the target is deposited on the substrate.

The magnetron sputtering device is characterized in comprising a magnet on the back side of the target, and the magnetic flux (leakage magnetic flux) leaked from the magnet onto the target surface causes the electrons to engage in cycloidal motion in the vicinity of the target surface, whereby plasma is generated efficiently.

[Patent Document 1] Japanese Published Unexamined Patent Application No. H10-88333

SUMMARY OF THE INVENTION

Generally speaking, if the foregoing magnetron sputtering device is used to sputter a nonmagnetic material particle-dispersed ferromagnetic material sputtering target, since much of the magnetic flux from the magnet will pass through the target, which is a ferromagnetic material, the leakage magnetic flux will decrease, and there is a major problem in that a discharge does not occur during the sputtering, or, the discharge is unstable even if a discharge does occur.

In order to overcome this problem, the following methods can be considered; namely, increasing the volume ratio of the nonmagnetic material particles, or decreasing the content ratio of Co. Nevertheless, these methods are not substantial solutions since the intended granular film cannot be obtained.

Moreover, although the leakage magnetic flux can be improved by thinning the thickness of the target, in this case the target life is shortened, and costs will increase since the target needs to be replaced frequently.

In light of the above, the present inventors examined the influence of the sintering temperature on the magnetic properties of the target in order to improve the leakage magnetic flux of the nonmagnetic material particle-dispersed ferromagnetic material sputtering target. Consequently, it has been discovered that, if the sintering temperature is lowered, the leakage magnetic flux will increase when using the same mixed powder and producing a target of the same composition and same shape.

Nevertheless, in the foregoing case, the relative density of the target fell below 98%, and the inventors faced a new problem of the generation of particles.

In light of the foregoing problems, an object of this invention is to provide a nonmagnetic material particle-dispersed ferromagnetic material sputtering target capable of improving the leakage magnetic flux to obtain a stable electrical discharge with a magnetron sputtering device, and which has high density and generates few particles during sputtering.

In order to achieve the foregoing object, as a result of intense study, the present inventors discovered that a target with a large leakage magnetic flux can be obtained by adjusting the target structure, and further discovered that the density of this target can be increased sufficiently and particles generated during the sputtering can be reduced.

Based on the foregoing discovery, the present invention provides a nonmagnetic material particle-dispersed ferromagnetic material sputtering target comprising a mixture of an alloy containing 5 mol % or more and 20 mol % or less of Cr and Co as the remainder thereof, and nonmagnetic material particles, wherein the structure of the target includes a phase (A) in which the nonmagnetic material particles are uniformly micro-dispersed in the alloy, and a spherical alloy phase (B) dispersed in the phase (A) in which the ratio of its volume in the target is 4% or more and 40% or less.

The present invention also provides a nonmagnetic material particle-dispersed ferromagnetic material sputtering target comprising a mixture of an alloy containing 5 mol % or more and 20 mol % or less of Cr, 5 mol % or more and 30 mol % or less of Pt, and Co as the remainder thereof, and nonmagnetic material particles, wherein the structure of the target includes a phase (A) in which the nonmagnetic material particles are uniformly micro-dispersed in the alloy, and a spherical alloy phase (B) dispersed in the phase (A) in which the ratio of its volume in the target is 4% or more and 40% or less.

The present invention additionally provides a nonmagnetic material particle-dispersed ferromagnetic material sputtering target comprising a mixture of an alloy containing 5 mol % or more and 20 mol % or less of Cr, 5 mol % or more and 30 mol % or less of Pt, 0.5 mol % or more and 8 mol % or less of B, and Co as the remainder thereof, and nonmagnetic material particles, wherein the structure of the target includes a phase (A) in which the nonmagnetic material particles are uniformly micro-dispersed in the alloy, and a spherical alloy phase (B) dispersed in the phase (A) in which the ratio of its volume in the target is 4% or more and 40% or less.

With the nonmagnetic material particle-dispersed ferromagnetic material sputtering target of the present invention, the volume ratio of the spherical alloy phase (B) is set to be 4% or more and 40% or less in the volume of the overall target containing the phase (A) in which the nonmagnetic material particles as the matrix are uniformly micro-dispersed therein. The reason for this is because, if the volume ratio of the spherical alloy phase (B) is smaller than the foregoing numerical range, the improvement of the leakage magnetic flux is minimal.

Meanwhile, if the volume ratio of the spherical alloy phase (B) is greater than the foregoing numerical range, the volume ratio of the nonmagnetic material particles will increase relatively in the phase (A) depending on the composition of the target. Thus, it becomes difficult to uniformly micro-disperse the nonmagnetic material particles, and a different problem of the increase of particles during the sputtering will arise.

In light of the above, the nonmagnetic material particle-dispersed ferromagnetic material sputtering target of the present invention has a spherical alloy phase (B) of 4% or more and 40% or less based on a volume ratio. Note that, the reason that the alloy composition of the target is limited to the foregoing composition is in consideration of the fact that it is a material for use in a magnetic recording film of a hard disk drive.

In the foregoing nonmagnetic material particle-dispersed ferromagnetic material sputtering target, it is effective if the spherical alloy phase (B) contained in the target structure forms an alloy phase of a composition where 25 mol % or more of Cr is concentrated in the vicinity of the center, and the content of Cr toward the outer peripheral part becomes lower than the central part. The present invention provides this kind of target.

Specifically, with this kind of target, the spherical alloy phase (B) possesses significant non-uniformity at the central part and the outer peripheral part. This can be clearly confirmed by measuring the element distribution of the polished surface of the target with an electron probe micro analyzer (EPMA).

The distribution status of the Cr concentration in the spherical alloy phase (B) will change depending on the sintering temperature and properties of the raw material powder. Here, as described above, the existence of a spherical alloy phase (B) shows a unique structure of the target of the present invention, and is a major cause of increasing the leakage magnetic flux of the target of the present invention.

The mechanism of the existence of the spherical alloy phase (B) increasing the leakage magnetic flux is not necessarily clear, but the these reasons are speculated.

Foremost, the spherical alloy phase (B) includes, to no small extent, areas where the Cr concentration is low and where it is high, and it is considered that lattice strain exists at locations where the fluctuation in concentration is significant.

If there is lattice strain, the magnetic moments of the Co atoms will mutually take on a nonequilibrium state, and a stronger magnetic field is required for aligning the direction of these magnetic moments.

Accordingly, in comparison to cases where the metal element is uniformly dispersed and there is no lattice strain, the magnetic permeability will decrease. Thus, the amount of magnetic flux from the magnet of the magnetron sputtering device that passes through the target will decrease, and the amount that is leaked on the target surface will increase.

Secondly, it is considered that the area in the spherical alloy phase (B) where the Cr concentration is high is blocking the movement of the magnetic domain wall as a precipitate. Consequently, the magnetic permeability of the target will decrease, and the leakage magnetic flux will increase.

With a rollable ferromagnetic material target, a method of applying dislocation in the target by cold rolling and improving the leakage magnetic flux is well known, and assumingly, similar effects are yielded with the spherical alloy phase (B).

Moreover, since the area in the phase (B) where the Cr concentration is high blocks the magnetic interaction in the ferromagnetic phase as the mother phase, the existence of an area with a high Cr concentration could be affecting the leakage magnetic flux.

Here, the term "spherical" as used herein refers to a three-dimensional shape including a true sphere, pseudo sphere, oblate spheroid (rotating oval body), and pseudo oblate spheroid, and in all cases, the difference between the long axis and the short axis is 0 to 50%. Namely, it could also be said that "spherical" means that the ratio of the maximum value to the minimum value of the length from the center to the outer periphery thereof is 2 or less. Within this range, even if there are some irregularities at the outer peripheral part, it is possible to form a phase (B) with a non-uniform composition. If it is difficult to confirm the spherical shape itself, setting the ratio of the maximum value to the minimum value of the length from the center of cross section of the phase (B) to the outer periphery thereof to be 2 or less is possible.

Thus, if the alloy phase (B) is spherical, it becomes difficult for voids to be generated at the interface of the phase (A) and the phase (B) during sintering and the density tends to increase. Moreover, since the spherical phase will have a smaller surface area if it is the same volume, the diffusion with the neighboring metal powders (Co powder, Pt powder and the like) does not advance easily, and it becomes easy to form a phase (B) with a non-uniform composition; that is, an alloy phase of a composition where 25 mol % or more of Cr is concentrated in the vicinity of the center, and the content of Cr toward the outer peripheral part becomes lower than the central part.

Moreover, the diameter of the spherical alloy phase (B) is desirably within a range of 50 to 200 μm. Since there is an upper limit in the volume ratio of the spherical alloy phase (B) in the overall target, if it is greater than the foregoing numerical range, the number of spherical alloy phases (B) that contribute to the improvement of the leakage magnetic flux will decrease, and the improvement of the leakage magnetic flux will decrease.

Meanwhile, if it is less than the foregoing numerical range, the diffusion of the metal elements will advance when attempting to obtain a high density target with sufficient sintering temperature, and it becomes difficult for the spherical alloy phase (B) with a Cr concentration distributed to be formed. Accordingly, in the present invention, it could be said that it is desirable to generate a spherical alloy phase (B) with a diameter within the foregoing numerical range.

The nonmagnetic material particle-dispersed ferromagnetic material sputtering target of the present invention is desirably a material that is not reduced or decomposed even when the nonmagnetic material is ignited to 900 to 1300° C. together with a metal material in a vacuum or an inert gas atmosphere. For example, the foregoing material can be selected from a nonmagnetic material such as carbon and oxides, nitrides and carbides made of Cr, Ta, Si, Ti, Zr, Al, Nb and B, and the like. This aims to avoid any unexpected influence of the fluctuation in composition as a result of such material becoming reduced or decomposed during the production of the target.

These nonmagnetic material particles are desirably 30% or less in the target based on a volume ratio. The reason of the volume ratio of the nonmagnetic material particles set to be 30% or less is because it becomes difficult to uniformly micro-disperse the nonmagnetic material particles in the phase (A) if the volume ratio is any greater, and a different problem of the increase of particles during the sputtering will arise.

The nonmagnetic material particle-dispersed ferromagnetic material sputtering target of the present invention desirably has a relative density of 98% or more. As a result of the relative density being 98% or more, the adhesion of the alloy and nonmagnetic material particles will increase. Therefore, the nonmagnetic material particles are inhibited from falling off during the sputtering, and the generation of particles can be reduced.

The relative density as used herein is a value obtained by dividing the measured density of the target by the calculated density (also referred to as the logical density).

The calculated density is the density when hypothesizing that the target constituents are mutually diffused or coexist without reacting, and is calculated with the following formula.

Formula: Calculated density=Σ(molecular weight of constituents×molar ratio of constituents)/Σ(molecular weight of constituents×molar ratio of constituents/literature value density of constituents)

Here, Σ means taking the sum of all target constituents.

The target that is adjusted as described above become a target with a large leakage magnetic flux, and stable electrical discharge can be obtained since the promotion of ionization of inert gas will efficiently advance when the target is used in a magnetron sputtering device. Moreover, since the thickness of the target can be made thick, there is an advantage in that the replacement frequency of the target can be reduced, and a magnetic thin film can be produced with low cost.

In addition, as a result of achieving high densification, there is also an advance in that the generation of particles can be reduced.

DETAILED DESCRIPTION OF THE INVENTION

Figure 1:
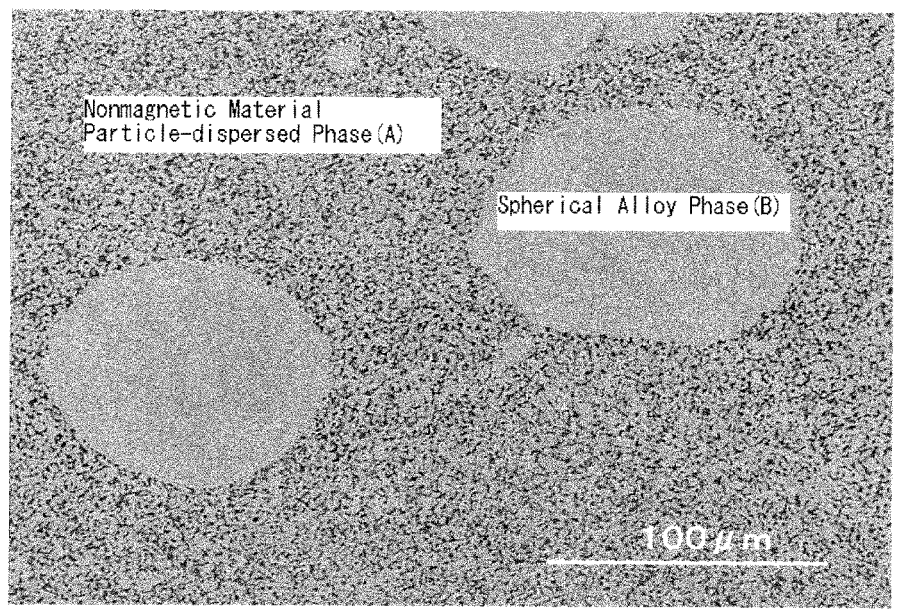
FIG. 1 is a structure image upon observing the target surface of Example 1 with a scanning electron microscope (SEM).

Upon producing the nonmagnetic material particle-dispersed ferromagnetic material sputtering target of the present invention, foremost, the powders of elements of Co, Cr, Pt, B to be produced or the alloy powders of these metals are prepared.

These powders desirably have a maximum particle size of 20 μm or less. These metal powders, and oxide powder of one or more types selected from Cr, Ta, Si, Ti, Zr, Al, Nb, B as the nonmagnetic material are pulverized and mixed with a well-known method such as by using a ball mill or the like.

In addition the foregoing oxide powder as the nonmagnetic material powder, nitride powder, carbide powder or carbon powder may also be used, but desirably nonmagnetic material powder with a maximum particle size of 5 μm or less is used.

Moreover, Co—Cr spherical powder with a diameter in the range of 50 to 200 μm is prepared, and mixed with the foregoing mixed powder with a mixer. The Co—Cr spherical powder that is used here can be obtained by sieving the powder preparing with the gas atomization method. In addition, as the mixer, a sun-and-planet motion-type mixer or a sun-and-planet motion-type agitator/mixer is preferably used.

The powder obtained as described above is molded and sintered using a vacuum hot press device and cut into the intended shape in order to prepare the nonmagnetic material particle-dispersed ferromagnetic material sputtering target of the present invention.

The foregoing Co—Cr spherical powder corresponds to the spherical alloy phase (B) that is observed in the target structure. The composition of the Co—Cr spherical powder is desirably set so that the Cr content is 25 mol % or more and 70 mol % or less.

The reason that the composition of the Co—Cr spherical powder is set within the foregoing range is because, if the Cr content is less than the foregoing range, it is difficult for a Cr-concentrated area to be formed in the spherical alloy phase (B), and the improvement in the leakage magnetic flux cannot be expected. Moreover, if the Cr content is greater than the foregoing range, voids assumed to be Kirkendall voids are generated inside the spherical alloy phase (B) depending on the sintering conditions, and this will invokes the deterioration in the target density.

The Co—Cr spherical powder in the foregoing composition range is used, but the volume ratio in the target after sintering is calculated and weighed to be 4% or more and 40% or less.

Moreover, the molding and sintering processes are not limited to hot press, and the plasma discharge sintering method or the hot isostatic sintering method may also be used. The holding temperature during sintering is preferably set to the lowest temperature within the temperature range in which the target will sufficiently densify. In many cases the temperature is within the range of 900 to 1300° C. although this will depend on the target composition.

EXAMPLES

The present invention is now explained with reference to the Examples and Comparative Examples. Note that these Examples are merely illustrative and the present invention shall in no way be limited thereby. In other words, various modifications and other embodiments are covered by the present invention, and the present invention is limited only by the scope of its claims.

Example 1

Comparative Example 1

In Example 1, Co powder with an average particle size of 3 μm, $SiO_2$ powder with an average particle size of 1 μm, and Co—Cr spherical powder with a diameter within the range of 50 to 150 μm and containing 60 mol % of Cr were prepared as the raw material powders. These powders were respectively weighed at a weight ratio of Co powder 68.91 wt %, $SiO_2$ powder 8.28 wt %, and Co—Cr spherical powder 22.81 wt % to achieve a target composition of 77.5 Co-14.5 Cr-8 $SiO_2$ (mol %). Subsequently, Co powder and $SiO_2$ powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1150° C., holding time of 2 hours, and welding pressure of 30 MPa to obtain a sintered compact. This was further cut with a lathe to obtain a disk-shaped target with a diameter of 180.00 mm and thickness of 7.00 mm.

Measurement of the leakage magnetic flux was performed according to ASTM F2086-01 (Standard Test Method for Pass Through Flux of Circular Magnetic Sputtering Targets, Method 2). The leakage magnetic flux measured by fixing the target center and rotating it 0 degrees, 30 degrees, 60 degrees, 90 degrees, and 120 degrees was divided by the value of the reference field defined in the ASTM and represented in percentage by multiplying 100 thereto. The result of averaging the foregoing five points is indicated in Table 1 as the average leakage magnetic flux (%).

In Comparative Example 1, Co powder with an average particle size of 3 μm, Cr powder with an average particle size of 5 μm, and $SiO_2$ powder with an average particle size of 1 μm were prepared as the raw material powders. These powders were respectively weighed at a weight ratio of Co powder 78.73 wt %, Cr powder 12.99 wt %, and $SiO_2$ powder 8.28 wt % to achieve a target composition of 77.5 Co-14.5 Cr-8 $SiO_2$ (mol %).

These powders were placed in a ball mill pot with a capacity of 10 liters together with zirconia balls as the grinding medium, and rotated and mixed for 20 hours.

Subsequently, the foregoing mixed powder was filled in a carbon mold, and hot pressed in a vacuum atmosphere under the following conditions; namely, temperature of 1150° C., holding time of 2 hours, and welding pressure of 30 MPa to obtain a sintered compact. This was further cut with a lathe to obtain a disk-shaped target with a diameter of 180.00 mm and thickness of 7.00 mm, and the average leakage magnetic flux was measured. The results are shown in Table 1.

TABLE 1

| | Raw material powder | Volume ratio of spherical alloy phase | Average leakage magnetic flux | Relative density |
|---|---|---|---|---|
| Example 1 | Co powder, $SiO_2$ powder, Co-60 mol % Cr spherical powder | 20% | 63% | 99.3% |
| Comparative Example 1 | Co powder, Cr powder, $SiO_2$ powder | — | 48% | 99.7% |

As shown in Table 1, the average leakage magnetic flux of the target of Example 1 was 63%, and considerable improvement from the 48% of Comparative Example 1 has been confirmed. Moreover, in Example 1 the relative density was 99.3%, and a high density target exceeding 98% was obtained.

Figure 2:
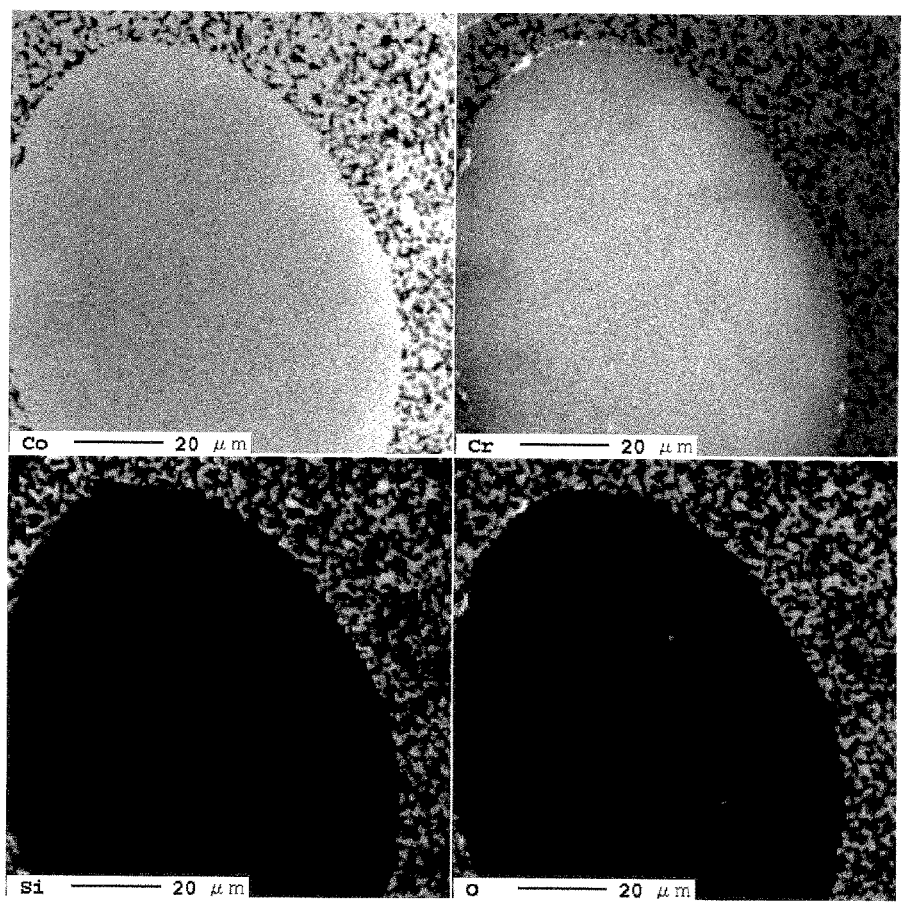
FIG. 2 is a diagram showing an element distribution image upon measuring the target surface of Example 1 with an electron probe micro analyzer (EPMA).

The structure image upon observing the target polished surface of Example 1 with a scanning electron microscope (SEM) is shown in FIG. 1, and the element distribution image upon particularly measuring the portion of the spherical alloy phase with EPMA is shown in FIG. 2. As shown with the structure image of FIG. 1, what is extremely unique in Example 1 is that a large spherical alloy phase, which does not contain $SiO_2$ particles, is dispersed in a matrix in which the $SiO_2$ particles are micro-dispersed.

As shown in FIG. 2, the white portion in the element distribution image of EPMA is the area with a high concentration of the relevant element. Specifically, the concentration of Co and Cr is high in the portion of the spherical alloy phase, and particularly the concentration of Cr becomes higher (whiter) from the peripheral part toward the central part. Based on the measurement results of EPMA, it has been confirmed that, with a spherical alloy phase, a Cr-rich phase in which 25 mol % or more of Cr is concentrated exists in the vicinity of the center, and the concentration of Cr becomes lower toward the outer periphery.

Meanwhile, in FIG. 2, Si and O are black in the area of the spherical alloy phase, and it is evident that they hardly exist in this alloy phase.

Figure 3:
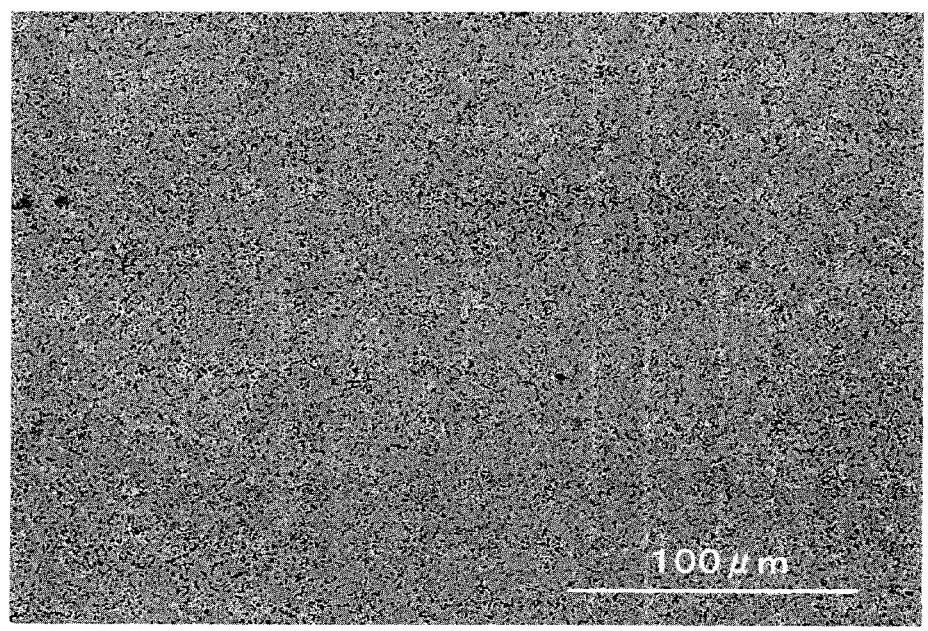
FIG. 3 is a structure image upon observing the target surface of Comparative Example 1 with a scanning electron microscope (SEM).

Whereas, in the structure image of the target polished surface obtained with Comparative Example 1 shown in FIG. 3, it was not possible to observe any spherical alloy phase in the matrix with the $SiO_2$ particles dispersed therein.

Example 2

Comparative Example 2

In Example 2, Co powder with an average particle size of 3 μm, Pt powder with an average particle size of 2 μm, $SiO_2$ powder with an average particle size of 1 μm, and Co—Cr spherical powder with a diameter within the range of 50 to 150 μm and containing 40 mol % of Cr were prepared as the raw material powders.

These powders were respectively weighed at a weight ratio of Co powder 26.62 wt %, Pt powder 39.16 wt %, $SiO_2$ powder 6.03 wt %, and Co—Cr spherical powder 28.19 wt % to achieve a target composition of 60 Co-16 Cr-16 Pt-8 $SiO_2$ (mol %).

Subsequently, the Co powder, Pt powder, and $SiO_2$ powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1150° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 2.

In Comparative Example 2, Co powder with an average particle size of 3 μm, Cr powder with an average particle size of 5 μm, Pt powder with an average particle size of 2 μm, and $SiO_2$ powder with an average particle size of 1 μm were prepared as the raw material powders.

These powders were respectively weighed at a weight ratio of Co powder 44.37 wt %, Cr powder 10.44 wt %, Pt powder 39.16 wt %, and $SiO_2$ powder 6.03 wt % to achieve a target composition of 60 Co-16 Cr-16 Pt-8 $SiO_2$ (mol %).

These powders were placed in a ball mill pot with a capacity of 10 liters together with zirconia balls as the grinding medium, and rotated and mixed for 20 hours.

Subsequently, the foregoing mixed powder was filled in a carbon mold, and hot pressed in a vacuum atmosphere under the following conditions; namely, temperature of 1150° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 2.

TABLE 2

| | Raw material powder | Volume ratio of spherical alloy phase | Average leakage magnetic flux | Relative density |
| --- | --- | --- | --- | --- |
| Example 2 | Co powder, Pt powder, $SiO_2$ powder, Co-40 mol % Cr spherical powder | 31% | 70% | 98.3% |
| Comparative Example 2 | Co powder, Cr powder, Pt powder, $SiO_2$ powder | — | 63% | 98.8% |

As shown in Table 2, the average leakage magnetic flux of the target of Example 2 was 70%, and considerable improvement from the 63% of Comparative Example 2 has been confirmed. Moreover, in Example 2 the relative density was 98.3%, and a high density target exceeding 98% was obtained.

Figure 4:
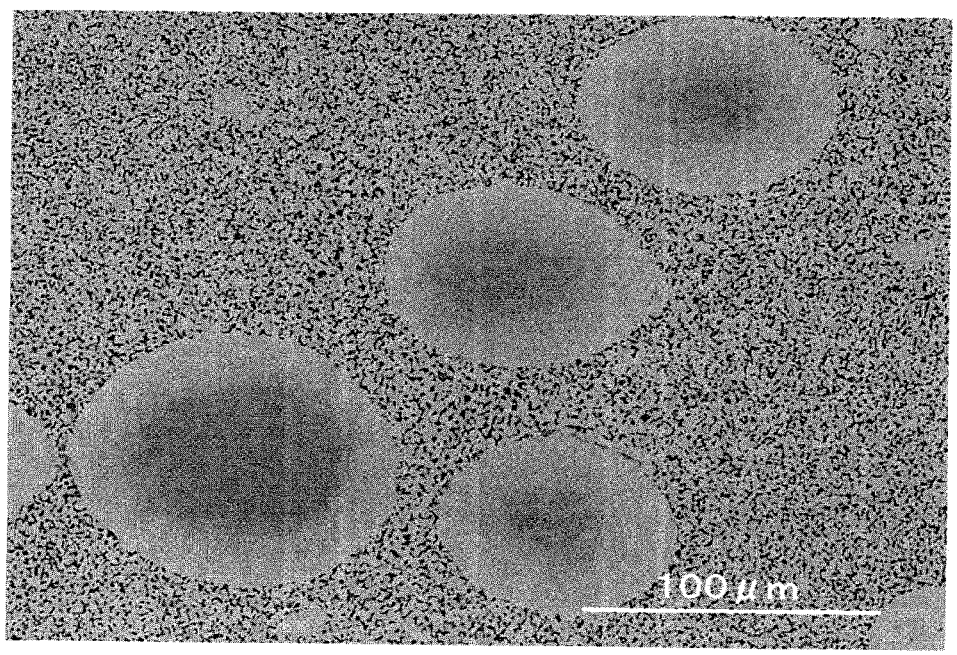
FIG. 4 is a structure image upon observing the target surface of Example 2 with a scanning electron microscope (SEM).
Figure 5:
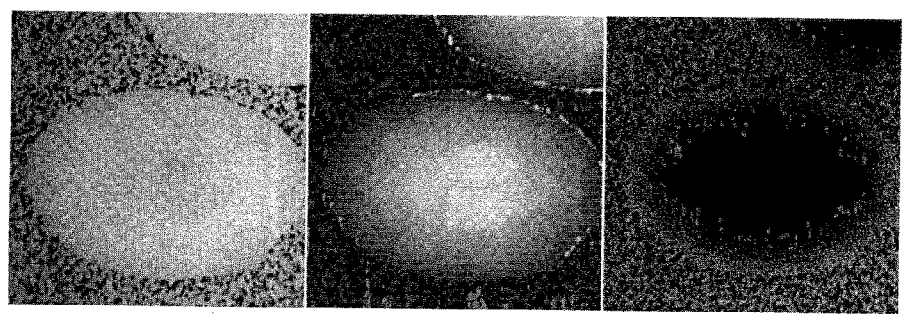
FIG. 5 is a diagram showing an element distribution image upon measuring the target surface of Example 2 with an electron probe micro analyzer (EPMA).
Figure 5:
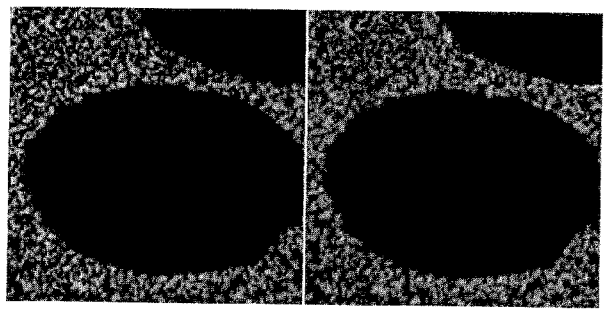

The structure image upon observing the target polished surface of Example 2 with a scanning electron microscope (SEM) is shown in FIG. 4, and the element distribution image upon particularly measuring the portion of the spherical alloy phase with EPMA is shown in FIG. 5. As shown with the structure image of FIG. 4, what is extremely unique in Example 2 is that a large spherical alloy phase, which does not contain $SiO_2$ particles, is dispersed in a matrix in which the $SiO_2$ particles are micro-dispersed.

As shown in FIG. 4, the white portion in the element distribution image of EPMA is the area with a high concentration of the relevant element. Specifically, the concentration of Co and Cr is high in the portion of the spherical alloy phase, and particularly the concentration of Cr becomes higher (whiter) from the peripheral part toward the central part. Based on the measurement results of EPMA, it has been confirmed that, with a spherical alloy phase, a Cr-rich phase in which 25 mol % or more of Cr is concentrated exists in the vicinity of the center, and the concentration of Cr becomes lower toward the outer periphery.

Meanwhile, in FIG. 5, Pt exists at the peripheral edge of the spherical alloy phase but hardly exist at the central part. And, in FIG. 5, Si and O are black in the area of the spherical alloy phase, and it is evident that they hardly exist in this alloy phase.

Figure 6:
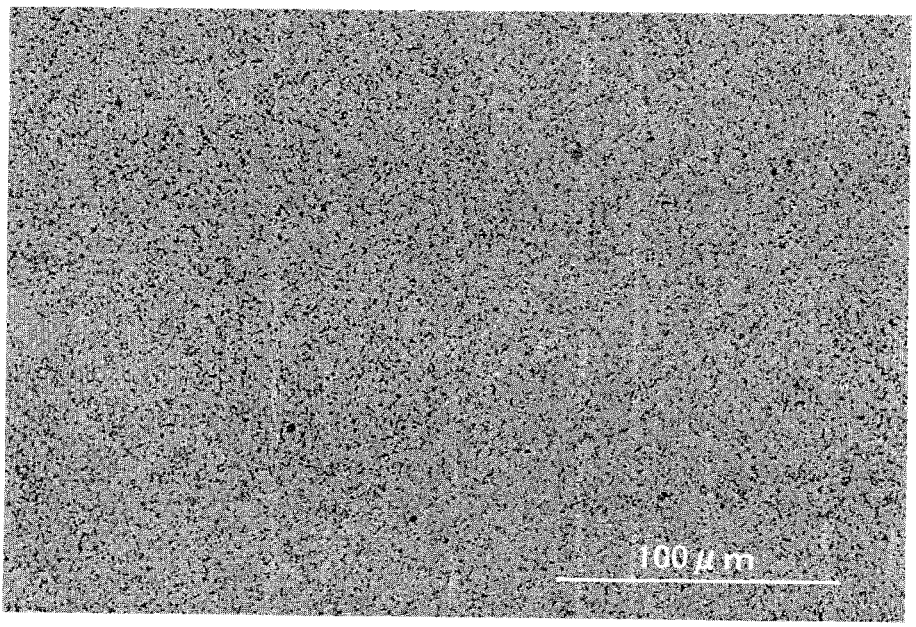
FIG. 6 is a structure image upon observing the target surface of Comparative Example 2 with a scanning electron microscope (SEM).

Whereas, in the structure image of the target polished surface obtained with Comparative Example 2 shown in FIG. 6, it was not possible to observe any spherical alloy phase in the matrix with the $SiO_2$ particles dispersed therein.

Example 3

Comparative Example 3

In Example 3, Co powder with an average particle size of 3 μm, Pt powder with an average particle size of 2 μm, B powder with an average particle size of 10 μm, $TiO_2$ powder with an average particle size of 0.5 μm, and Co—Cr spherical powder with a diameter within the range of 100 to 200 μm and containing 40 mol % of Cr were prepared as the raw material powders.

These powders were respectively weighed at a weight ratio of Co powder 22.89 wt %, Pt powder 39.99 wt %, B powder 0.4 wt %, $TiO_2$ powder 7.94 wt %, and Co—Cr spherical powder 28.78 wt % to achieve a target composition of 56 Co-16.5 Cr-16.5 Pt-3 B-8 $TiO_2$ (mol %).

Subsequently, the Co powder, Pt powder, B powder, and $TiO_2$ powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 3.

In Comparative Example 3, Co powder with an average particle size of 3 µm, Cr powder with an average particle size of 5 µm, Pt powder with an average particle size of 2 µm, B powder with an average particle size of 10 µm, and $TiO_2$ powder with an average particle size of 0.5 µm were prepared as the raw material powders. These powders were respectively weighed at a weight ratio of Co powder 41 wt %, Cr powder 10.67 wt %, Pt powder 39.99 wt %, B powder 0.4 wt %, and $TiO_2$ powder 7.94 wt % to achieve a target composition of 56 Co-16.5 Cr-16.5 Pt-3 B-8 $TiO_2$ (mol %).

These powders were placed in a ball mill pot with a capacity of 10 liters together with zirconia balls as the grinding medium, and rotated and mixed for 20 hours.

The foregoing mixed powder was filled in a carbon mold, and hot pressed in a vacuum atmosphere under the following conditions; namely, temperature of 1050° C., holding time of 2 hours, and welding pressure of 30 MPa to obtain a sintered compact.

This was further cut with a lathe to obtain a disk-shaped target with a diameter of 165.10 mm and thickness of 6.35 mm, and the average leakage magnetic flux was measured. The results are shown in Table 3.

Figure 9:
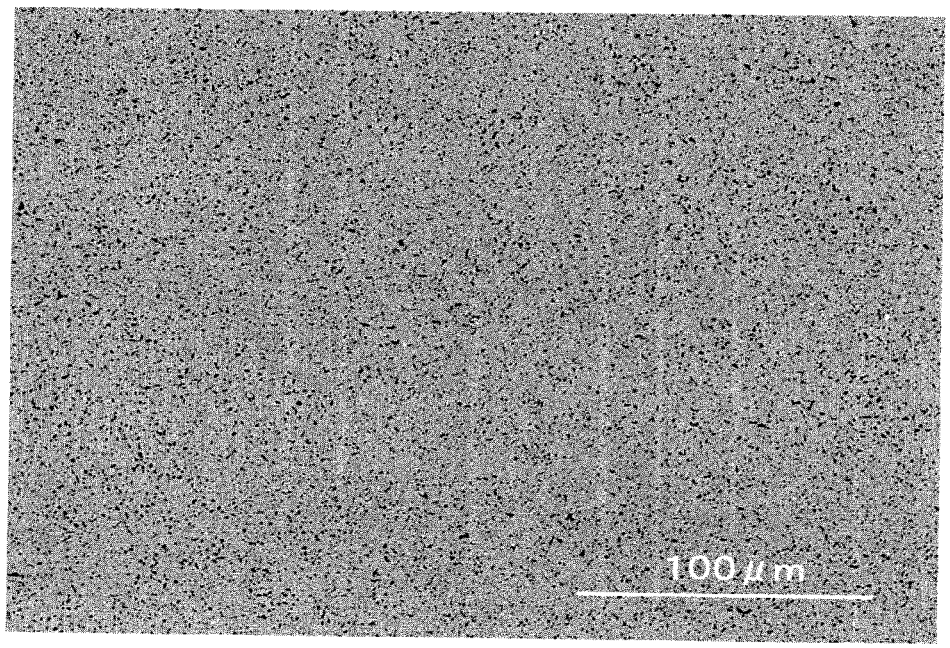
FIG. 9 is a structure image upon observing the target surface of Comparative Example 3 with a scanning electron microscope (SEM).

Whereas, in the structure image of the target polished surface obtained with Comparative Example 3 shown in FIG. 9, it was not possible to observe any spherical alloy phase in the matrix with the $TiO_2$ particles dispersed therein.

Example 4

Comparative Example 4

In Example 4, Co powder with an average particle size of 3 µm, $B_2O_3$ powder with an average particle size of 3 µm, $SiO_2$ powder with an average particle size of 1 µm, and Co—Cr spherical powder with a diameter within the range of 75 to 150 µm and containing 40 mol % of Cr were prepared as the raw material powders. These powders were respectively weighed at a weight ratio of Co powder 56.45 wt %, $B_2O_3$ powder 2.39 wt %, $SiO_2$ powder 6.19 wt %, and Co—Cr spherical powder 34.97 wt % to achieve a target composition of 77.5 Co-14.5 Cr-2 $B_2O_3$-6 $SiO_2$ (mol %).

Subsequently, the Co powder, $B_2O_3$ powder, and $SiO_2$ powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

TABLE 3

| | Raw material powder | Volume ratio of spherical alloy phase | Average leakage magnetic flux | Relative density |
|---|---|---|---|---|
| Example 3 | Co powder, Pt powder, $TiO_2$ powder, Co-40 mol % Cr spherical powder | 35% | 72% | 99.2% |
| Comparative Example 3 | Co powder, Cr powder, Pt powder, $TiO_2$ powder, B powder, | — | 64% | 98.7% |

As shown in Table 3, the average leakage magnetic flux of the target of Example 3 was 72%, and considerable improvement from the 64% of Comparative Example 3 has been confirmed. Moreover, in Example 3 the relative density was 99.2%, and a high density target exceeding 98% was obtained.

Figure 7:
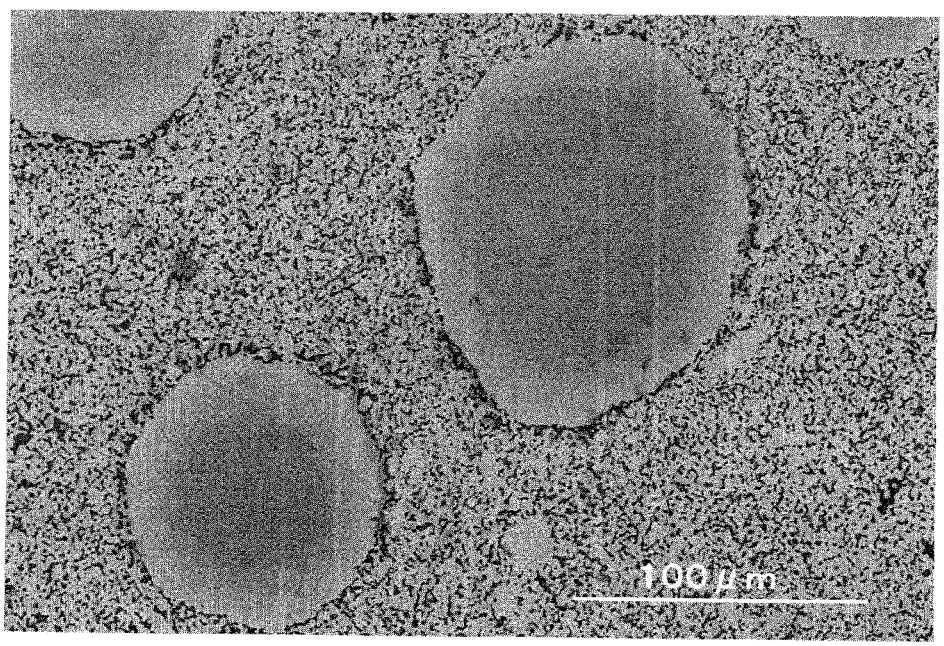
FIG. 7 is a structure image upon observing the target surface of Example 3 with a scanning electron microscope (SEM).
Figure 8:
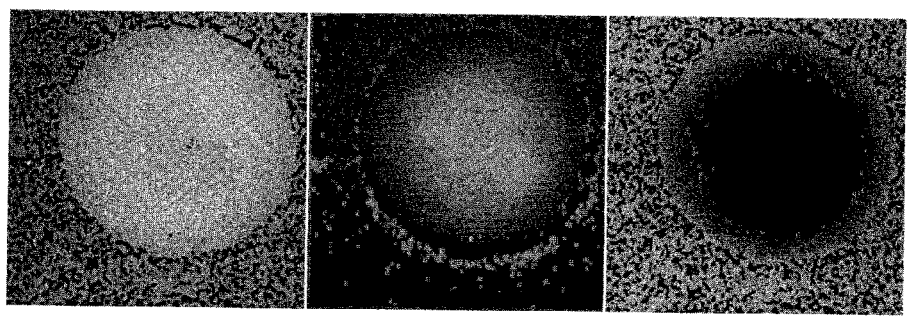
FIG. 8 is a diagram showing an element distribution image upon measuring the target surface of Example 3 with an electron probe micro analyzer (EPMA).
Figure 8:
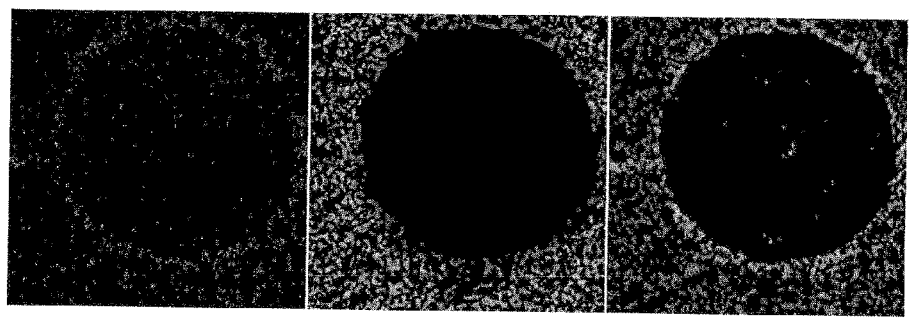

The structure image upon observing the target polished surface of Example 3 with a scanning electron microscope (SEM) is shown in FIG. 7, and the element distribution image upon particularly measuring the portion of the spherical alloy phase with EPMA is shown in FIG. 8. As shown with the structure image of FIG. 7, what is extremely unique in Example 3 is that a large spherical alloy phase, which does not contain $TiO_2$ particles, is dispersed in a matrix in which the $TiO_2$ particles are micro-dispersed.

As shown in FIG. 8, the white portion in the element distribution image of EPMA is the area with a high concentration of the relevant element. Specifically, the concentration of Co and Cr is high in the portion of the spherical alloy phase, and particularly the concentration of Cr becomes higher (whiter) from the peripheral part toward the central part. Based on the measurement results of EPMA, it has been confirmed that, with a spherical alloy phase, a Cr-rich phase in which 25 mol % or more of Cr is concentrated exists in the vicinity of the center, and the concentration of Cr becomes lower toward the outer periphery.

Meanwhile, in FIG. 8, Pt exists at the peripheral edge of the spherical alloy phase but hardly exist at the central part. Moreover, in FIG. 8, B is hardly white in the area of the spherical alloy phase, but Ti and O are black, and it is evident that they hardly exist in this alloy phase.

This mixed powder was filled in a carbon mold, and hot pressed in a vacuum atmosphere under the following conditions; namely, temperature of 1000° C., holding time of 2 hours, and welding pressure of 30 MPa to obtain a sintered compact. This was further cut with a lathe to obtain a disk-shaped target with a diameter of 180.00 mm and thickness of 7.00 mm, and the average leakage magnetic flux was measured. The results are shown in Table 4.

In Comparative Example 4, Co powder with an average particle size of 3 µm, Cr powder with an average particle size of 5 µm, $B_2O_3$ powder with an average particle size of 3 µm, and $SiO_2$ powder with an average particle size of 1 µm were prepared as the raw material powders. These powders were respectively weighed at a weight ratio of Co powder 78.47 wt %, Cr powder 12.95 wt %, $B_2O_3$ powder 2.39 wt %, and $SiO_2$ powder 6.19 wt % to achieve a target composition of 77.5 Co-14.5 Cr-2 $B_2O_3$-6 $SiO_2$ (mol %).

These powders were placed in a ball mill pot with a capacity of 10 liters together with zirconia balls as the grinding medium, and rotated and mixed for 20 hours.

The foregoing mixed powder was filled in a carbon mold, and hot pressed in a vacuum atmosphere under the following conditions; namely, temperature of 1000° C., holding time of 2 hours, and welding pressure of 30 MPa to obtain a sintered compact.

This was further cut with a lathe to obtain a disk-shaped target with a diameter of 180.00 mm and thickness of 7.00 mm, and the average leakage magnetic flux was measured. The results are shown in Table 4.

TABLE 4

| | Raw material powder | Volume ratio of spherical alloy phase | Average leakage magnetic flux | Relative density |
|---|---|---|---|---|
| Example 4 | Co powder, $B_2O_3$ powder, $SiO_2$ powder, Co-40 mol % Cr spherical powder | 29% | 68% | 99.7% |
| Comparative Example 4 | Co powder, Cr powder, $B_2O_3$ powder, $SiO_2$ powder | — | 53% | 99.9% |

As shown in Table 4, the average leakage magnetic flux of the target of Example 4 was 68%, and considerable improvement from the 53% of Comparative Example 4 has been confirmed. Moreover, in Example 4 the relative density was 99.7%, and a high density target exceeding 98% was obtained.

Upon observing the target polished surface of Example 4 with SEM, it has been confirmed that a large spherical alloy phase that does not contain $B_2O_3$ particles and $SiO_2$ particles are dispersed in a matrix in which $B_2O_3$ particles and $SiO_2$ particles are micro-dispersed. Moreover, upon acquiring the element distribution image using EPMA, it has been confirmed that the concentration of Co and Cr is high in the portion of the spherical alloy phase, and particularly the concentration of Cr becomes higher from the peripheral part to the central part.

Whereas, in the structure image of the target polished surface obtained with Comparative Example 4, it was not possible to observe any spherical alloy phase in the matrix with the $B_2O_3$ particles and $SiO_2$ particles dispersed therein.

Example 5

Comparative Example 5

In Example 5, Co powder with an average particle size of 3 μm, Pt powder with an average particle size of 2 μm, $TiO_2$ powder with an average particle size of 0.5 μm, $Cr_2O_3$ powder with an average particle size of 1 μm, and Co—Cr spherical powder with a diameter within the range of 75 to 150 μm and containing 40 mol % of Cr were prepared as the raw material powders. These powders were respectively weighed at a weight ratio of Co powder 24.89 wt %, Pt powder 36.6 wt %, $TiO_2$ powder 6.7 wt %, $Cr_2O_3$ powder 5.47 wt %, and Co—Cr spherical powder 26.34 wt % to achieve a target composition of 58.7 Co-15.65 Cr-15.65 Pt-7 $TiO_2$-3 $Cr_2O_3$ (mol %).

Subsequently, the Co powder, Pt powder, $TiO_2$ powder, and $Cr_2O_3$ powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1100° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 5.

In Comparative Example 5, Co powder with an average particle size of 3 μm, Cr powder with an average particle size of 5 μm, Pt powder with an average particle size of 2 μm, $TiO_2$ powder with an average particle size of 0.5 μm, and $Cr_2O_3$ powder with an average particle size of 1 μm were prepared as the raw material powders. These powders were respectively weighed at a weight ratio of Co powder 41.47 wt %, Cr powder 9.76 wt %, Pt powder 36.6 wt %, $TiO_2$ powder 6.7 wt %, and $Cr_2O_3$ powder 5.47 wt % to achieve a target composition of 58.7 Co-15.65 Cr-15.65 Pt-7 $TiO_2$-3 $Cr_2O_3$ (mol %).

These powders were placed in a ball mill pot with a capacity of 10 liters together with zirconia balls as the grinding medium, and rotated and mixed for 20 hours.

The foregoing mixed powder was filled in a carbon mold, and hot pressed in a vacuum atmosphere under the following conditions; namely, temperature of 1100° C., holding time of 2 hours, and welding pressure of 30 MPa to obtain a sintered compact.

This was further cut with a lathe to obtain a disk-shaped target with a diameter of 165.10 mm and thickness of 6.35 mm, and the average leakage magnetic flux was measured. The results are shown in Table 5.

TABLE 5

| | Raw material powder | Volume ratio of spherical alloy phase | Average leakage magnetic flux | Relative density |
|---|---|---|---|---|
| Example 5 | Co powder, Pt powder, $TiO_2$ powder, $Cr_2O_3$ powder, Co-40 mol % Cr spherical powder | 31% | 65% | 98.5% |
| Comparative Example 5 | Co powder, Cr powder, Pt powder, $TiO_2$ powder, $Cr_2O_3$ powder | — | 60% | 98.5% |

As shown in Table 5, the average leakage magnetic flux of the target of Example 5 was 65%, and considerable improvement from the 60% of Comparative Example 5 has been confirmed. Moreover, in Example 5 the relative density was 98.5%, and a high density target exceeding 98% was obtained.

Upon observing the target polished surface of Example 5 with SEM, it has been confirmed that a large spherical alloy phase that does not contain $TiO_2$ particles and $Cr_2O_3$ particles are dispersed in a matrix in which $TiO_2$ particles and $Cr_2O_3$ particles are micro-dispersed. Moreover, upon acquiring the element distribution image using EPMA, it has been confirmed that the concentration of Co and Cr is high in the portion of the spherical alloy phase, and particularly the concentration of Cr becomes higher from the peripheral part to the central part.

Whereas, in the structure image of the target polished surface obtained with Comparative Example 5, it was not possible to observe any spherical alloy phase in the matrix with the $TiO_2$ particles and $Cr_2O_3$ particles dispersed therein.

Example 6

Comparative Example 6

In Example 6, Co powder with an average particle size of 3 µm, Pt powder with an average particle size of 2 µm, B powder with an average particle size of 10 µm, $TiO_2$ powder with an average particle size of 0.5 µm, $SiO_2$ powder with an average particle size of 1 µm, and Co—Cr spherical powder with a diameter within the range of 75 to 150 µm and containing 40 mol % of Cr were prepared as the raw material powders. These powders were respectively weighed at a weight ratio of Co powder 25.26 wt %, Pt powder 39.35 wt %, B powder 0.27 wt %, $TiO_2$ powder 3.02 wt %, $SiO_2$ powder 3.79 wt %, Co—Cr spherical powder 28.31 wt % to achieve a target composition of 58 Co-16 Cr-16 Pt-2 B-3 $TiO_2$-5 $SiO_2$ (mol %).

Subsequently, the Co powder, Pt powder, B powder, $TiO_2$ powder, and $SiO_2$ powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 6.

In Comparative Example 6, Co powder with an average particle size of 3 µm, Cr powder with an average particle size of 5 µm, Pt powder with an average particle size of 2 µm, B powder with an average particle size of 10 µm, $TiO_2$ powder with an average particle size of 0.5 µm, and $SiO_2$ powder with an average particle size of 1 µm were prepared as the raw material powders. These powders were respectively weighed at a weight ratio of Co powder 43.08 wt %, Cr powder 10.49 wt %, Pt powder 39.35 wt %, B powder 0.27 wt %, $TiO_2$ powder 3.02 wt %, and $SiO_2$ powder 3.79 wt % to achieve a target composition of 58 Co-16 Cr-16 Pt-2 B-3 $TiO_2$-5 $SiO_2$ (mol %).

These powders were placed in a ball mill pot with a capacity of 10 liters together with zirconia balls as the grinding medium, and rotated and mixed for 20 hours.

The foregoing mixed powder was filled in a carbon mold, and hot pressed in a vacuum atmosphere under the following conditions; namely, temperature of 1050° C., holding time of 2 hours, and welding pressure of 30 MPa to obtain a sintered compact.

This was further cut with a lathe to obtain a disk-shaped target with a diameter of 165.10 mm and thickness of 6.35 mm, and the average leakage magnetic flux was measured. The results are shown in Table 6.

TABLE 6

| | Raw material powder | Volume ratio of spherical alloy phase | Average leakage magnetic flux | Relative density |
|---|---|---|---|---|
| Example 6 | Co powder, Pt powder, B powder, $TiO_2$ powder, $SiO_2$ powder, Co-40 mol % Cr spherical powder | 29% | 70% | 99.1% |
| Comparative Example 6 | Co powder, Cr powder, Pt powder, B powder, $TiO_2$ powder, $SiO_2$ powder | — | 63% | 99.0% |

As shown in Table 6, the average leakage magnetic flux of the target of Example 6 was 70%, and considerable improvement from the 63% of Comparative Example 6 has been confirmed. Moreover, in Example 6 the relative density was 99.1%, and a high density target exceeding 98% was obtained.

Upon observing the target polished surface of Example 6 with SEM, it has been confirmed that a large spherical alloy phase that does not contain $TiO_2$ particles and $SiO_2$ particles are dispersed in a matrix in which $TiO_2$ particles and $SiO_2$ particles are micro-dispersed. Moreover, upon acquiring the element distribution image using EPMA, it has been confirmed that the concentration of Co and Cr is high in the portion of the spherical alloy phase, and particularly the concentration of Cr becomes higher from the peripheral part to the central part.

Whereas, in the structure image of the target polished surface obtained with Comparative Example 6, it was not possible to observe any spherical alloy phase in the matrix with the $TiO_2$ particles and $SiO_2$ particles dispersed therein.

Example 7

Comparative Example 7

In Example 7, Co powder with an average particle size of 3 µm, Pt powder with an average particle size of 2 µm, C powder with an average particle size of 1 µm, and Co—Cr spherical powder with a diameter within the range of 75 to 150 µm and containing 40 mol % of Cr were prepared as the raw material powders. These powders were respectively weighed at a weight ratio of Co powder 26.66 wt %, Pt powder 39.19 wt %, C powder 5.95 wt %, and Co—Cr spherical powder 28.2 wt % to achieve a target composition of 45.66 Co-12.17 Cr-12.17 Pt-30 C (mol %).

Subsequently, the Co powder, Pt powder, and C powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1300° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 7.

In Comparative Example 7, Co powder with an average particle size of 3 μm, Cr powder with an average particle size of 5 μm, Pt powder with an average particle size of 2 μm, and C powder with an average particle size of 1 μm were prepared as the raw material powders. These powders were respectively weighed at a weight ratio of Co powder 44.41 wt %, Cr powder 10.45 wt %, Pt powder 39.19 wt %, and C powder 5.95 wt % to achieve a target composition of 45.66 Co-12.17 Cr-12.17 Pt-30 C (mol %).

These powders were placed in a ball mill pot with a capacity of 10 liters together with zirconia balls as the grinding medium, and rotated and mixed for 20 hours.

The foregoing mixed powder was filled in a carbon mold, and hot pressed in a vacuum atmosphere under the following conditions; namely, temperature of 1300° C., holding time of 2 hours, and welding pressure of 30 MPa to obtain a sintered compact.

This was further cut with a lathe to obtain a disk-shaped target with a diameter of 165.10 mm and thickness of 6.35 mm, and the average leakage magnetic flux was measured. The results are shown in Table 7.

Example 8

Comparative Example 8

In Example 8, Co powder with an average particle size of 3 μm, Pt powder with an average particle size of 2 μm, SiC powder with an average particle size of 2 μm, and Co—Cr spherical powder with a diameter within the range of 75 to 150 μm and containing 40 mol % of Cr were prepared as the raw material powders. These powders were respectively weighed at a weight ratio of Co powder 25.9 wt %, Pt powder 38.1 wt %, SiC powder 8.58 wt %, and Co—Cr spherical powder 27.42 wt % to achieve a target composition of 54.78 Co-14.61 Cr-14.61 Pt-16 SiC (mol %).

Subsequently, the Co powder, Pt powder, and SiC powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1000° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 8.

TABLE 7

|  | Raw material powder | Volume ratio of spherical alloy phase | Average leakage magnetic flux | Relative density |
| --- | --- | --- | --- | --- |
| Example 7 | Co powder, Pt powder, C powder, Co-40 mol % Cr spherical powder | 31% | 67% | 98.0% |
| Comparative Example 7 | Co powder, Cr powder, Pt powder, C powder | — | 61% | 98.5% |

As shown in Table 7, the average leakage magnetic flux of the target of Example 7 was 67%, and considerable improvement from the 61% of Comparative Example 7 has been confirmed. Moreover, in Example 7 the relative density was 98.0%, and a high density target was obtained.

Upon observing the target polished surface of Example 7 with SEM, it has been confirmed that a large spherical alloy phase that does not contain C particles are dispersed in a matrix in which C particles are micro-dispersed. And upon acquiring the element distribution image using EPMA, it has been confirmed that the concentration of Co and Cr is high in the portion of the spherical alloy phase, and particularly the concentration of Cr becomes higher from the peripheral part to the central part.

Whereas, in the structure image of the target polished surface obtained with Comparative Example 7, it was not possible to observe any spherical alloy phase in the matrix with the C particles dispersed therein.

In Comparative Example 8, Co powder with an average particle size of 3 μm, Cr powder with an average particle size of 5 μm, Pt powder with an average particle size of 2 μm, and SiC powder with an average particle size of 2 μm were prepared as the raw material powders. These powders were respectively weighed at a weight ratio of Co powder 43.16 wt %, Cr powder 10.16 wt %, Pt powder 38.10 wt %, and SiC powder 8.58 wt % to achieve a target composition of 54.78 Co-14.61 Cr-14.61 Pt-16 SiC (mol %).

These powders were placed in a ball mill pot with a capacity of 10 liters together with zirconia balls as the grinding medium, and rotated and mixed for 20 hours.

The foregoing mixed powder was filled in a carbon mold, and hot pressed in a vacuum atmosphere under the following conditions; namely, temperature of 1000° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 8.

TABLE 8

| | Raw material powder | Volume ratio of spherical alloy phase | Average leakage magnetic flux | Relative density |
|---|---|---|---|---|
| Example 8 | Co powder, Pt powder, SiC powder, Co-40 mol % Cr spherical powder | 31% | 66% | 98.5% |
| Comparative Example 8 | Co powder, Cr powder, Pt powder, SiC powder | — | 58% | 98.6% |

As shown in Table 8, the average leakage magnetic flux of the target of Example 8 was 66%, and considerable improvement from the 58% of Comparative Example 8 has been confirmed. Moreover, in Example 8 the relative density was 98.5%, and a high density target exceeding 98% was obtained.

Upon observing the target polished surface of Example 8 with SEM, it has been confirmed that a large spherical alloy phase that does not contain SiC particles are dispersed in a matrix in which SiC particles are micro-dispersed. And upon acquiring the element distribution image using EPMA, it has been confirmed that the concentration of Co and Cr is high in the portion of the spherical alloy phase, and particularly the concentration of Cr becomes higher from the peripheral part to the central part.

Whereas, in the structure image of the target polished surface obtained with Comparative Example 8, it was not possible to observe any spherical alloy phase in the matrix with the SiC particles dispersed therein.

Example 9

Comparative Example 9

In Example 9, Co powder with an average particle size of 3 μm, Pt powder with an average particle size of 2 μm, TiN powder with an average particle size of 5 μm, and Co—Cr spherical powder with a diameter within the range of 75 to 150 μm and containing 40 mol % of Cr were prepared as the raw material powders. These powders were respectively weighed at a weight ratio of Co powder 24.99 wt %, Pt powder 36.74 wt %, TiN powder 11.83 wt %, and Co—Cr spherical powder 26.44 wt % to achieve a target composition of 55.44 Co-14.78 Cr-14.78 Pt-15 TiN (mol %).

Subsequently, the Co powder, Pt powder, and TiN powder were placed in a ball mill pot with a capacity of 10 liters together with zirconia balls as the grinding medium, and rotated and mixed for 20 hours. The obtained mixed powder and the Co—Cr spherical powder were mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1000° C., holding time of 2 hours, and welding pressure of 30 MPa to obtain a sintered compact. This was further cut with a lathe to obtain a disk-shaped target with a diameter of 165.10 mm and thickness of 6.35 mm, and the average leakage magnetic flux was measured. The results are shown in Table 9.

In Comparative Example 9, Co powder with an average particle size of 3 μm, Cr powder with an average particle size of 5 μm, Pt powder with an average particle size of 2 μm, and TiN powder with an average particle size of 5 μm were prepared as the raw material powders. These powders were respectively weighed at a weight ratio of Co powder 41.64 wt %, Cr powder 9.79 wt %, Pt powder 36.74 wt %, and TiN powder 11.83 wt % to achieve a target composition of 55.44 Co-14.78 Cr-14.78 Pt-15 TiN (mol %).

These powders were placed in a ball mill pot with a capacity of 10 liters together with zirconia balls as the grinding medium, and rotated and mixed for 20 hours.

The foregoing mixed powder was filled in a carbon mold, and hot pressed in a vacuum atmosphere under the following conditions; namely, temperature of 1000° C., holding time of 2 hours, and welding pressure of 30 MPa to obtain a sintered compact.

This was further cut with a lathe to obtain a disk-shaped target with a diameter of 165.10 mm and thickness of 6.35 mm, and the average leakage magnetic flux was measured. The results are shown in Table 9.

TABLE 9

| | Raw material powder | Volume ratio of spherical alloy phase | Average leakage magnetic flux | Relative density |
|---|---|---|---|---|
| Example 9 | Co powder, Pt powder, TiN powder, Co-40 mol % Cr spherical powder | 30% | 63% | 98.5% |
| Comparative Example 9 | Co powder, Cr powder, Pt powder, TiN powder | — | 57% | 98.3% |

As shown in Table 9, the average leakage magnetic flux of the target of Example 9 was 63%, and considerable improvement from the 57% of Comparative Example 9 has been confirmed. Moreover, in Example 9 the relative density was 98.5%, and a high density target exceeding 98% was obtained.

Upon observing the target polished surface of Example 9 with SEM, it has been confirmed that a large spherical alloy phase that does not contain TiN particles are dispersed in a matrix in which TiN particles are micro-dispersed. And, upon acquiring the element distribution image using EPMA, it has been confirmed that the concentration of Co and Cr is high in the portion of the spherical alloy phase, and particularly the concentration of Cr becomes higher from the peripheral part to the central part.

Whereas, in the structure image of the target polished surface obtained with Comparative Example 9, it was not possible to observe any spherical alloy phase in the matrix with the TiN particles dispersed therein.

In Examples 1 to 9, the existence of the spherical alloy phase (B) was clearly confirmed in all cases, and it is evident that the existence of the phase (A) in which nonmagnetic material particles are uniformly micro-dispersed therein and the spherical alloy phase (B) having a diameter within the range of 50 to 200 μm and surrounded by the phase (A) plays an extremely important role in improving the leakage magnetic flux.

The present invention is able to realize stable and highly productive sputtering of a nonmagnetic material particle-dispersed ferromagnetic sputtering target with a magnetron sputtering device by improving the leakage magnetic flux as a result of adjusting the structure of such nonmagnetic material particle-dispersed ferromagnetic sputtering target to comprise a phase (A) with nonmagnetic material particles uniformly micro-dispersed therein, and a spherical alloy phase (B) dispersed in the phase (A) in which the ratio of its volume in the target is 4% or more and 40% or less, and by further achieving the high densification of the target.

The present invention is useful as a nonmagnetic material particle-dispersed ferromagnetic material sputtering target for use in the deposition of a magnetic thin film of a magnetic recording medium, and particularly of a granular magnetic recording film of a hard disk adopting the perpendicular magnetic recording system.

The invention claimed is:

1. A ferromagnetic material sputtering target, comprising a sintered compact consisting of Cr of 5 mol % or more and 20 mol % or less, Co, and particles of nonmagnetic material, wherein the sintered compact has a structure having an alloy phase (A) as a matrix in which the particles of the nonmagnetic material and an alloy phase (B) in the form of spherical or spheroidal three dimensional shaped particles of a Co—Cr alloy not containing the particles of the nonmagnetic material are dispersed, the alloy phase (B) having a volume ratio of 4% or more and 40% or less relative to a total volume of the target, and each of the spherical or spheroidal three dimensional shaped particles of the alloy phase (B) having a diameter of 50 to 200 μm and a long axis and a short axis such that a difference between a length of the long axis and a length of the short axis is 0 to 50% of the length of the long axis.

2. The ferromagnetic material sputtering target according to claim 1, wherein each of the particles of the alloy phase (B) has a center and a periphery, and wherein Cr content at the center is 25 mol % or more and decreases toward the periphery.

3. The ferromagnetic material sputtering target according to claim 1, wherein the nonmagnetic material is one or more substances selected from the group consisting of carbon, oxides, nitrides, and carbides, wherein said oxides, nitrides and carbides being made of one or more elements selected from the group consisting of Cr, Ta, Si, Ti, Zr, Al, Nb and B, and wherein each of the particles of the nonmagnetic material have a diameter of 5 μm or less.

4. The ferromagnetic material sputtering target according to claim 3, wherein the nonmagnetic material has a volume ratio of 30% or less relative to a total volume of the target.

5. The ferromagnetic material sputtering target according to claim 1, wherein the target has a relative density of 98% or more.

6. The ferromagnetic material sputtering target according to claim 1, wherein the particles of the nonmagnetic material are dispersed only within the alloy phase (A) and not within the spherical or spheroidal three dimensional shaped particles of the alloy phase (B).

7. A ferromagnetic material sputtering target, comprising a sintered compact consisting of 5 mol % or more and 20 mol % or less of Cr, 5 mol % or more and 30 mol % or less of Pt, Co, and particles of nonmagnetic material, wherein the sintered compact has a structure having an alloy phase (A) as a matrix in which the particles of the nonmagnetic material and an alloy phase (B) in the form of spherical or spheroidal three dimensional shaped particles of a Co—Cr alloy not containing the particles of the nonmagnetic material are dispersed, the alloy phase (B) having a volume ratio of 4% or more and 40% or less relative to a total volume of the target, and each of the spherical or spheroidal three dimensional shaped particles of the alloy phase (B) having a diameter of 50 to 200 μm and a long axis and a short axis such that a difference between a length of the long axis and a length of the short axis is 0 to 50% of the length of the long axis.

8. The ferromagnetic material sputtering target according to claim 7, wherein each of the particles of the alloy phase (B) has a center and a periphery, and wherein Cr content at the center is 25 mol % or more and decreases toward the periphery.

9. The ferromagnetic material sputtering target according to claim 7, wherein the nonmagnetic material is one or more substances selected from the group consisting of carbon, oxides, nitrides, and carbides, wherein said oxides, nitrides and carbides being made of one or more elements selected from the group consisting of Cr, Ta, Si, Ti, Zr, Al, Nb and B, and wherein each of the particles of the nonmagnetic material have a diameter of 5 μm or less.

10. The ferromagnetic material sputtering target according to claim 9, wherein the nonmagnetic material has a volume ratio of 30% or less relative to a total volume of the target.

11. The ferromagnetic material sputtering target according to claim 7, wherein the target has a relative density of 98% or more.

12. The ferromagnetic material sputtering target according to claim 7, wherein the particles of the nonmagnetic material are dispersed only within the alloy phase (A) and not within the spherical or spheroidal three dimensional shaped particles of the alloy phase (B).

13. A ferromagnetic material sputtering target, comprising a sintered compact consisting of 5 mol % or more and 20 mol % or less of Cr, 5 mol % or more and 30 mol % or less of Pt, 0.5 mol % or more and 8 mol % or less of B, Co, and particles of nonmagnetic material, wherein the sintered compact has a structure having an alloy phase (A) as a matrix in which the particles of the nonmagnetic material and an alloy phase (B) in the form of spherical or spheroidal three dimensional shaped particles of a Co—Cr alloy not containing the particles of the nonmagnetic material are dispersed, the alloy phase (B) having a volume ratio of 4% or more and 40% or less relative to a total volume of the target, and each of the spherical or spheroidal three dimensional shaped particles of the alloy phase (B) having a diameter of 50 to 200 μm and a long axis and a short axis such that a difference between a length of the long axis and a length of the short axis is 0 to 50% of the length of the long axis.

14. The ferromagnetic material sputtering target according to claim 13, wherein each of the particles of the alloy phase (B) has a center and a periphery, and wherein Cr content at the center is 25 mol % or more and decreases toward the periphery.

15. The ferromagnetic material sputtering target according to claim 13, wherein the nonmagnetic material is one or more substances selected from the group consisting of carbon, oxides, nitrides, and carbides, wherein said oxides, nitrides and carbides being made of one or more elements selected from the group consisting of Cr, Ta, Si, Ti, Zr, Al, Nb, and B, and wherein the particles of the nonmagnetic material have a maximum diameter of 5 μm or less.

16. The ferromagnetic material sputtering target according to claim 15, wherein the nonmagnetic material has a volume ratio of 30% or less relative to a total volume of the target.

17. The ferromagnetic material sputtering target according to claim 13, wherein the target has a relative density of 98% or more.

* * * * *